United States Patent [19]
Arkens et al.

[11] Patent Number: 5,977,232
[45] Date of Patent: Nov. 2, 1999

[54] FORMALDEHYDE-FREE, ACCELERATED CURE, AQUEOUS COMPOSITION FOR BONDING GLASS FIBER HEAT-RESISTANT NONWOVENS

[75] Inventors: Charles Thomas Arkens, Hatfield; Scott Lind Egolf, Lansdale, both of Pa.

[73] Assignee: Rohm and Haas Company, Philadelphia, Pa.

[21] Appl. No.: 08/904,713

[22] Filed: Aug. 1, 1997

[51] Int. Cl.$^6$ .................... C08K 3/38; C08K 3/16
[52] U.S. Cl. .................... 524/404; 524/701
[58] Field of Search .................... 528/281, 282, 528/283, 285, 335, 336, 363, 296, 299; 525/367; 524/404, 700, 701; 428/378, 391

[56] References Cited

U.S. PATENT DOCUMENTS

| | | | |
|---|---|---|---|
| 2,917,484 | 12/1959 | Kray et al. ................... | 528/283 |
| 4,321,351 | 3/1982 | Zuppinger et al. ............ | 528/281 |
| 4,933,421 | 6/1990 | Morehead .................... | 528/91 |
| 5,108,798 | 4/1992 | Guerro et al. ................ | 525/127 |
| 5,199,953 | 4/1993 | Fung et al. . | |
| 5,273,549 | 12/1993 | Didier et al. ................. | 8/127.1 |
| 5,318,990 | 6/1994 | Strauss . | |

FOREIGN PATENT DOCUMENTS

| | | |
|---|---|---|
| 0 488 605 A2 | 6/1992 | European Pat. Off. . |
| 0 583 086 A1 | 2/1994 | European Pat. Off. . |
| 0 651 088 A1 | 5/1995 | European Pat. Off. . |
| 2 077 281 | 12/1981 | United Kingdom . |

OTHER PUBLICATIONS

Hawley's Condensed Chemical Dictionary, 12th Edition, p. 622, 1993.
The Merck index, 12th Edition, p. 4877, 1996.
Kasem et al. p. 114, vol. 11(2), Industrial & Engineering Chemistry Product Research and Development, 1972.
European Search Report dated Dec. 15, 1998.

*Primary Examiner*—Vasu Jagannathan
*Assistant Examiner*—Ling-Siu Choi
*Attorney, Agent, or Firm*—Kevin F. Gironda; Ronald D. Bakule

[57] ABSTRACT

A formaldehyde-free curable aqueous composition comprising:
(a) a polyacid comprising at least two carboxylic acid groups, anhydride groups, or salts of the polyacid thereof;
(b) an active hydrogen compound containing at least two active hydrogen groups selected from the group consisting of hydroxyl, primary amino, secondary amino, and mixtures thereof; and
(c) a fluoroborate accelerator; wherein the ratio of the number of equivalents of said carboxylic acid groups, anhydride groups, or salts thereof to the number of equivalents of said hydroxyl groups is from 1/0.01 to about 1/3, and wherein said carboxylic acid groups, anhydride groups, or salts thereof are neutralized to an extent of less than 35% with a fixed base is disclosed. A method for curing formaldehyde-free polyacids and a method for bonding glass fiber heat-resistant nonwovens with a formaldehyde-free binder are further disclosed.

9 Claims, No Drawings

FORMALDEHYDE-FREE, ACCELERATED CURE, AQUEOUS COMPOSITION FOR BONDING GLASS FIBER HEAT-RESISTANT NONWOVENS

This invention relates to a formaldehyde-free, fluoroborate accelerated curable aqueous composition, a method for curing polyacids, and a method for bonding glass fiber heat-resistant nonwovens.

Glass fiber heat-resistant nonwovens are composed of fibers which may be consolidated by purely mechanical means such as, for example, treatment with a polymeric binder; or by a combination of mechanical and chemical means before, during, or after nonwoven fabric formation. The polymeric binder is frequently cross-linked by reaction with formaldehyde producing resins. There is current legislation which limits formaldehyde emissions as well as proposed legislation which may further limit or eliminate formaldehyde emissions. There is a continuing need for formaldehyde free curable aqueous compositions, methods for curing polyacids, and methods for bonding glass fiber heat-resistant nonwovens.

U.S. Pat. No. 5,273,549 discloses a method of cross-linking cellulose with phosphorous containing cross-linking agents. The patent further discloses a list of catalysts which will accelerate the cross-linking reaction. The list of catalysts includes maleic, citric, phosphoric, sulfuric, hydrochloric, lactic, and fluoroboric acids. Metallic salts of the acids are also disclosed. U.S. Pat. No. 5,318,990 discloses a fibrous glass binder comprising a polycarboxy polymer, a monomeric trihydric alcohol, and a phosphorous containing organic acid catalyst.

Despite the disclosures, there is a continuing need for formaldehyde-free curable aqueous compositions, methods for curing polyacids, and methods for treating glass fiber heat-resistant nonwovens.

In a first aspect, the present invention provides a formaldehyde-free curable aqueous composition comprising:
(a) a polyacid comprising at least two carboxylic acid groups, anhydride groups, or salts of the polyacid thereof;
(b) an active hydrogen compound comprising at least two active hydrogen compounds selected from the group consisting of an active hydrogen compound containing at least two active hydrogen groups selected from the group consisting of hydroxyl, primary amino, secondary amino, and mixtures hereof; and
(c) a fluoroborate accelerator;
wherein the ratio of the number of equivalents of said carboxylic acid groups, anhydride groups, or salts thereof to the number of equivalents of said active hydrogen groups is from 1/0.01 to about 1/3 and wherein said carboxylic acid groups, anhydride groups, or salts thereof are neutralized to an extent of less than 35% by weight with a fixed base.

In a second aspect, the present invention provides a method for curing formaldehyde-free polyacids comprising:
(a) forming a formaldehyde-free curable aqueous composition comprising admixing:
(1) a polyacid comprising at least two carboxylic acid groups, anhydride groups, or salts thereof;
(2) an an active hydrogen compound containing at least two active hydrogen groups selected from the group consisting of hydroxyl, primary amino, secondary amino, and mixtures thereof; and
(3) a fluoroborate accelerator;
wherein the ratio of the number of equivalents of said carboxylic acid groups, anhydride groups, or salts thereof to the number of equivalents of said active hydrogen groups is from 1/0.01 to about 1/3, and wherein said carboxylic acid groups, anhydride groups, or salts thereof are neutralized to an extent of less than 35% with a fixed base, and
(b) heating said curable aqueous composition at a temperature of from 120° C. to 400° C.

In a third aspect, the present invention provides a method for treating glass fiber heat-resistant nonwovens with a formaldehyde-free binder comprising:
(a) forming a formaldehyde-free curable aqueous composition comprising admixing:
(1) a polyacid comprising at least two carboxylic acid groups, anhydride groups, or salts thereof;
(2) an active hydrogen compound containing at least two active hydrogen groups selected from the group consisting of hydroxyl, primary amino, secondary amino, and mixtures thereof; and
(3) a fluoroborate accelerator; wherein the ratio of the number of equivalents of said carboxylic acid groups, anhydride groups, or salts thereof to the number of equivalents of said active hydrogen groups is from 1/0.01 to about 1/3, and wherein said carboxylic acid groups, anhydride groups, or salts thereof are neutralized to an extent of less than 35% with a fixed base, and
(b) contacting said glass fiber heat resistant nonwoven with said formaldehyde-free curable aqueous composition; and
(c) heating said formaldehyde-free curable aqueous composition at a temperature of from 120° C. to 400° C.

The formaldehyde-free curable aqueous composition of this invention is a substantially thermoplastic, or substantially uncrosslinked composition when it is applied to the substrate, although low levels of deliberate or adventitious crosslinking may be present. On heating the binder, the binder is dried and curing is effected, either sequentially or concurrently. As used herein, curing is defined as a structural or morphological change which is sufficient to alter the properties of a flexible, porous substrate to which an effective amount of polymeric binder has been applied such as, for example, covalent chemical reaction, ionic interaction or clustering, improved adhesion to the substrate, phase transformation or inversion, hydrogen bonding, and the like.

By "formaldehyde-free" is meant that the composition is substantially free from formaldehyde, and does not liberate substantial formaldehyde as a result of drying and/or curing. Typically, less than 1 part per million formaldehyde, based on the weight of the composition, is present in a formaldehyde-free composition. In order to minimize the formaldehyde content of the waterborne composition it is preferred, when preparing a polymer-containing formaldehyde-free curable aqueous composition, to use polymerization adjuncts such as, for example, initiators, reducing agents, chain transfer agents, biocides, surfactants, and the like, which are themselves free from formaldehyde, do not generate formaldehyde during the polymerization process, and do not generate or emit formaldehyde during the treatment of heat-resistant nonwovens.

The formaldehyde-free curable aqueous composition contains a polyacid. The polyacid must be sufficiently nonvolatile so that it will substantially remain available for reaction with the polyol in the composition during heating and curing operations. When the polyacid is a compound with a molecular weight less than about 1000, bearing at least two carboxylic acid groups, anhydride groups, or salts thereof, the polyacid typically is for example, citric acid, butane tricarboxylic acid, and cyclobutane tetracarboxylic acid.

When the polyacid is a polymeric polyacid, the polyacid typically is, for example, a polyester containing at least two carboxylic acid groups and an addition polymer or oligomer containing at least two copolymerized carboxylic acid-functional monomers. The polymeric polyacid is preferably an addition polymer formed from at least one ethylenically unsaturated monomer. The addition polymer may be in the form of a solution of the addition polymer in an aqueous medium such as, for example, an alkali-soluble resin which has been solubilized in a basic medium; in the form of an aqueous dispersion such as, for example, an emulsion-polymerized dispersion; or in the form of an aqueous suspension. "Aqueous" herein includes water and mixtures composed substantially of water and water-miscible solvents.

The addition polymer must contain at least two carboxylic acid groups, anhydride groups, or salts thereof. Ethylenically unsaturated carboxylic acids such as, for example, methacrylic acid, acrylic acid, crotonic acid, fumaric acid, maleic acid, 2-methyl maleic acid, itaconic acid, 2-methyl itaconic acid, α,β-dinethyl glutaric acid, monoalkyl maleates, and monoalkyl fumarates; ethylenically unsaturated anhydrides such as, for example, maleic anhydride, itaconic anhydride, acrylic anhydride, and methacrylic anhydride; and salts thereof, at a level of from about 1% to 100%, by weight, based on the weight of the addition polymer, may be used. Additional ethylenically unsaturated monomer may include acrylic ester monomers including methyl acrylate, ethyl acrylate, butyl acrylate, 2-ethylhexyl acrylate, decyl acrylate, methyl methacrylate, butyl methacrylate, isodecyl methacrylate, hydroxyethyl acrylate, hydroxyethyl methacrylate, and hydroxypropyl methacrylate; acrylamide or substituted acrylamides; styrene or substituted styrenes; butadiene; vinyl acetate or other vinyl esters; acrylonitrile or methacrylonitrile; and the like.

The addition polymer containing at least two carboxylic acid groups, anhydride groups, or salts thereof may have a molecular weight from about 300 to about 10,000,000. Preferred is a molecular weight from about 1000 to about 250,000. When the addition polymer is an alkali-soluble resin having a carboxylic acid, anhydride, or salt thereof, content of from about 5% to about 30%, by weight based on the total weight of the addition polymer, a molecular weight from about 7,000 to about 100,000 is preferred, higher molecular weight alkali-soluble resins leading to curable compositions which may exhibit excessive viscosity.

When the addition polymer is in the form of an aqueous dispersion or an aqueous suspension and low levels of precrosslinking or gel content are desired, low levels of multi-ethylenically unsaturated monomers such as, for example, allyl methacrylate, diallyl phthalate, 1,4-butylene glycol dimethacrylate, 1,6-hexanedioldiacrylate, and the like, may be used at a level of from about 0.01% to about 5%, by weight based on the weight of the acrylic emulsion copolymer.

When the addition polymer is in the form of an aqueous dispersion the diameter of the addition polymer particles may be from about 80 nanometers to about 1000 nanometers, as measured using a Brookhaven BI-90 Particle Sizer, which employs a light scattering technique. However, polymodal particle size distributions such as those disclosed in U.S. Pat. Nos. 4,384,056 and 4,539,361, may be employed and are within the scope of the present invention.

When the addition polymer is in the form of an aqueous dispersion the addition polymer particles may be made up of two or more mutually incompatible copolymers. These mutually incompatible copolymers may be present in various morphological configurations such as, for example, core/shell particles, core/shell particles with shell phases incompletely encapsulating the core, core/shell particles with a multiplicity of cores, interpenetrating network particles, and the like.

The addition polymer may be prepared by solution polymerization, emulsion polymerization, or suspension polymerization techniques for polymerizing ethylenically-unsaturated monomers, which are well known in the art. When it is desired to use emulsion polymerization, anionic or nonionic surfactants, or mixtures thereof, may be used. The polymerization may be carried out by various means such as, for example, with all of the monomer in the reaction kettle at the beginning of the polymerization reaction, with a portion of the monomer in emulsified form present in the reaction kettle at the beginning of the polymerization reaction, and with a small particle size emulsion polymer seed present in the reaction vessel at the beginning of the polymerization reaction.

The polymerization reaction to prepare the addition polymer may be initiated by various methods known in the art such as, for example, by using the thermal decomposition of an initiator and by using an oxidation-reduction reaction ("redox reaction") to generate free radicals to effect the polymerization. In another embodiment the addition polymer may be formed in the presence of phosphorous-containing chain transfer agents such as, for example, hypophosphorous acid and its salts, as is disclosed in U.S. Pat. No. 5,077,361, so as to incorporate the phosphorous-containing accelerator and the polyacid component in the same molecule.

Chain transfer agents such as mercaptans, polymercaptans, and halogen compounds may be used in the polymerization mixture in order to moderate the molecular weight of the acrylic emulsion copolymer. Generally, up to about 1% by weight, based on the weight of the mononess, of ($C_4$–$C_{20}$) alkyl mercaptans, mercaptopropionic acid, or esters of mercaptopropionic acid may be used.

The carboxyl groups of the polyacid component of the formaldehyde-free curable aqueous composition are neutralized with fixed base to an extent of less than about 35%, calculated on an equivalents basis. Contacting the addition polymer component before, during, or after the preparation of the curable aqueous composition, the addition polymer containing two carboxylic acid groups, anhydride groups, or the salts thereof, defined as neutralization herein, with a fixed base is required prior to treating a nonwoven substrate. Neutralization of less than about 35% of the carboxylic acid groups, calculated on an equivalents basis, with a fixed base is required. Neutralization of less than about 20% of the carboxylic acid groups, calculated on an equivalents basis, with a fixed base is preferred. Neutralization of less than about 5% of the carboxylic acid groups, calculated on an equivalents basis, with a fixed base is more preferred. When the half ester of a dicarboxylic acid or the anhydride of a dicarboxylic acid is used, the equivalents of acid are calculated to be equal to those of the corresponding dicarboxylic acid.

"Fixed base", or "permanent base", as used herein, refers to a monovalent base which is substantially non-volatile under the conditions of the treatment such as, for example, sodium hydroxide, potassium hydroxide, sodium carbonate, or t-butylammonium hydroxide. The fixed base must be sufficiently nonvolatile that it will substantially remain in the composition during heating and curing operations. Volatile bases such as, for example, ammonia or volatile lower alkyl amines, do not function as the fixed base of this invention, but may be used in addition to the fixed base; they do not contribute to the required degree of neutralization by a fixed base. Fixed multivalent bases such as, for example, calcium carbonate may tend to destabilize an aqueous dispersion, if the addition polymer is used in the form of an aqueous dispersion, but may be used in minor amount.

The formaldehyde-free curable aqueous composition also contains an active hydrogen compound containing at least two active hydrogen groups selected from the group consisting of hydroxyl, primary amino, secondary amino, and mixtures thereof. The active hydrogen compound must be sufficiently nonvolatile that it will substantially remain available for reaction with the polyacid in the composition during heating and curing operations. The active hydrogen compound may be a compound with a molecular weight less than about 1,000, bearing at least two active hydrogen groups such as, for example, ethylene glycol, glycerol, pentaerythritol, trimethylol propane, sorbitol, sucrose, glucose, resorcinol, catechol, pyrogallol, glycolated ureas, 1,4-cyclohexane diol, monoethanolamine, diethanolamine, triethanolamine, and certain reactive polyols such as, for example, β-hydroxyalkylamides such as, for example, bis-[N,N-di(β-hydroxyethyl)]adipamide, as may be prepared according to the teachings of U.S. Pat. No. 4,076,917, hereby incorporated herein by reference, or it may be an addition polymer with a molecular weight greater than about 1,000 containing at least two active hydrogen groups such as, for example, polyvinyl alcohol, partially hydrolyzed polyvinyl acetate, and homopolymers or copolymers of hydroxyethyl (meth)acrylate, hydroxypropyl (meth) acrylate, dimethylaminoethyl methacrylate, dimethylaminopropyl methacrylamide, and the like.

The ratio of the number of equivalents of carboxyl, anhydride, or salts thereof of the polyacid to the number of equivalents of active hydrogen in the active hydrogen compound is from about 1/0.01 to about 1/3. An excess of equivalents of carboxyl, anhydride, or salts thereof of the polyacid to the equivalents of active hydrogen in the active hydrogen compound is preferred. The more preferred ratio of the number of equivalents of carboxyl, anhydride, or salts thereof in the polyacid to the number of equivalents of active hydrogen in the active hydrogen compound is from about 1/0.1 to about 1/1. The most preferred ratio of the number of equivalents of carboxyl, anhydride, or salts thereof in the polyacid to the number of equivalents of active hydrogen in the active hydrogen compound is from about 1/0.2 to about 1/0.8.

The formaldehyde-free curable aqueous composition also contains a fluoroborate-containing accelerator. The accelerator may be, for example, fluoboric acid; an alkali metal fluoroborate salt such as sodium tetrafluoroborate or potassium tetrafluoroborate; a multi-valent metal fluoroborate salt such as calcium tetrafluoroborate, magnesium tetrafluoroborate, or zinc tetrafluoroborate; and ammonium tetrafluoroborate, as well as mixtures thereof. The fluoroborate-containing accelerator may be used at a level of from about 0.01% to about 10%, by weight based on the combined weight of the polyacid and the polyol. Preferred is a level of fluoroborate-containing accelerator of from about 0.1% to about 5%, by weight based on the combined weight of the polyacid and the polyol. Most preferred is a level of fluoroborate-containing accelerator of from about 0.5% to about 2%, by weight based on the combined weight of the polyacid and the polyol. The fluoroborate-containing accelerator may be used in combination with phosphorous-containing accelerators such as, for example, hypophosphorous acid, sodium hypophosphite, sodium phosphite, potassium phosphite, disdodium pyrophosphate, tetrasodium pyrophosphite, sodium tripolyphosphate, potassium tripolyphosphate, and potassium phosphate, as well as mixtures thereof. When used in combination, the fluoroborate-containing accelerator and the phosphorous-containing accelerator are unexpectedly efficient, such that levels as low as 0.5% of phosphorous-containing accelerator and 0.5% of fluoroborate-containing accelerator, based on the total weight of the composition, are effective in tensile strength retention.

The formaldehyde-free curable aqueous composition may contain, in addition, conventional treatment components such as, for example, emulsifiers, pigments, fillers, anti-migration aids, curing agents, coalescents, wetting agents, biocides, plasticizers, organosilanes, anti-foaming agents, colorants, waxes, and anti-oxidants.

The formaldehyde-free curable aqueous composition may be prepared by admixing the polyacid, the active hydrogen compound, and the fluoroborate-containing accelerator using conventional mixing techniques. In another embodiment a carboxyl- or anhydride-containing addition polymer and an active hydrogen compound may be present in the same addition polymer, which addition polymer would contain both carboxyl, anhydride, or salts thereof functionality and active hydrogen functionality. In another embodiment the salts of the carboxyl-group are salts of functional alkanolamines with at least two hydroxyl groups such as, for example, diethanolamine, triethanolamine, dipropanolamine, and di-isopropanolamine. Other embodiments will be apparent to one skilled in the art. As disclosed herein-above, the carboxyl groups of the polyacid may be neutralized to an extent of less than about 35% with a fixed base before, during, or after the mixing to provide the aqueous composition. Neutralization may be partially effected during the formation of the polyacid.

In one embodiment of this invention the formaldehyde-free curable aqueous composition may be used as a binder for heat-resistant nonwovens such as, for example, nonwovens which contain heat-resistant fibers such as, for example, aramid fibers, ceramic fibers, metal fibers, carbon fibers, polyimide fibers, certain polyester fibers, rayon fibers, and glass fibers. By "heat-resistant fibers" herein is meant fibers which are substantially unaffected by exposure to temperatures above about 120° C. Heat-resistant nonwovens may also contain fibers which are not in themselves heat-resistant such as, for example, certain polyester fibers, rayon fibers, nylon fibers, and superabsorbent fibers, in so far as they do not materially adversely affect the performance of the substrate.

The formaldehyde-free curable aqueous composition may be applied to nonwovens by conventional techniques such as, for example, air or airless spraying, padding, saturating, roll coating, curtain coating, beater deposition, coagulation, or the like.

The aqueous formaldehyde-free composition, after it is applied to a nonwoven, is heated to effect drying and curing. The duration and temperature of heating will affect the rate of drying, processability and handleability, and property development of the treated substrate. Heat treatment at about 120° C. to about 400° C. for a period of time between about 3 seconds to about 15 minutes may be carried out; treatment at about 150° C. to about 200° C. is preferred. The drying and curing functions may be effected in two or more distinct steps, if desired. For example, the composition may be first heated at a temperature and for a time sufficient to substantially dry but not to substantially cure the composition and then heated for a second time at a higher temperature and/or for a longer period of time to effect curing. Such a procedure, referred to as "B-staging", may be used to provide binder-treated nonwoven, for example, in roll form, which may at a later stage be cured, with or without forming or molding into a particular configuration, concurrent with the curing process.

The heat-resistant nonwovens may be used for applications such as, for example, insulation batts or rolls, as reinforcing mat for roofing or flooring applications, as roving, as microglass-based substrate for printed circuit boards or battery separators, as filter stock, as tape stock, and as reinforcement scrim in cementitious and non-cementitious coatings for masonry.

The following examples are intended to illustrate the formaldehyde-free curable aqueous composition and the use thereof as a binder for heat-resistant nonwovens. The following abbreviations are used herein: SHP=Sodium hypophosphite, $NaBF_4$=Sodium tetrafluoroborate, TEA=Triethanolamine, ppm=parts per million, %=percent, lbs./sq. ft.=pounds per square foot, lb=pound, Comp.=comparative, Square =100 square feet, BW=Basis weight=pounds/square, Wet tensile strength=tensile strength after one hour soak in 85° C. water-tested wet, % Retention=Wet tensile strength/ Dry tensile strength=×100, Mw=molecular weight.

EXAMPLE 1

Preparation of Glass Fiber Handsheets and Saturation of Sheets with Binder Composition A 110 gallon tank equipped with an air-driven mixer was filled with deionized water. The pH of the water was adjusted to 9.0 with ammonium hydroxide. Fourteen ppm of Rhodameen VP-532 SPB (Rhone-Poulenc) (polyoxyethylated alkyl amine), based on the weight of the water, were added to the water. The solution was stirred for 15 minutes, and then allowed to sit for 15 minutes. This solution is known as "white water". Five gallons of the white water was pumped into a 6 gallon stainless steel dispersion tank equipped with an air-driven mixer and four vertical baffles to provide more thorough mixing. The stirrer was turned on and 6.2 g of 1/4inch length glass fibers was added. This formed a glass fiber dispersion. The glass fiber dispersion was then mixed for 3 minutes. Polyester scrim was placed on the bottom of a 12 inch by 12 inch square Williams sheet mold. The mold was closed and half-filled with water. The stirrer in the dispersion tank was turned off. After 30 seconds, the valve on the dispersion tank was opened to drain the glass fiber dispersion into the sheet mold. Simultaneously, the drain valve on the sheet mold was opened. When the glass fiber dispersion had drained from the dispersion tank, absorbant paper was inserted into the nozzle to prevent any drips from marring the sheet before the sheet mold was fully drained. The sheet mold was opened and the scrim with the formed glass fiber sheet was lifted off and transferred to a screen stand. The excess water was vacuumed off with a large wet/dry vacuum cleaning device ("Shop Vac"™) which was fitted with a 14 inch head. The binder composition was applied with a perforated funnel, maintaining a gentle flow so that the fibers were not disturbed. The excess binder composition was vacuumed off. After one stroke was made, the glass fiber sheet was turned 90 degrees and another stroke was performed. This was called the "treated" glass fiber sheet. The treated glass fiber sheet was then transferred to another piece of scrim to prevent sticking to the first scrim. The glass fiber sheet was then dried and cured for 3 minutes at 190° C. in a high volume Werner-Mathis oven. The target loss on ignition was 22% and 0.5 lbs./100 sq. ft. basis weight.

EXAMPLE 2

Preparation of Binder Composition with Fluoboric Acid

To 50.11 grams of polyacrylic acid (45%)(Mw=9,000), was added 7.10 grams triethanolamine (98%), 0.62 grams fluoboric acid (48%), 14.93 grams (1.0%) Dow Corning Z-6040 silane [optional depending on glass fiber used] and 227.24 grams water. This mixture contains 10% active ingredients (all components other than water) with a pH about 3.0 and 8 cps viscosity (Brookfield LVF, #1 spindle at 60 rpm). The binder was applied as described in Example 1.

EXAMPLE 3–9

Preparation of Other Acid Containing Binder Compositions

Samples 3–9 and comparative A were prepared according to Example 2 with the ingredient amounts listed in Table 1. The binder was applied as described in Example 1.

TABLE 1

| Example | Grams Polyacid | Grams TEA | Grams Accelerator | Grams Silane (1.0%) | Grams Water |
|---|---|---|---|---|---|
| Comp. A | 53.56 | 7.56 | None | 15.88 | 240.45 |
| 3 | 53.56 | 7.56 | 2.36 (p-toluene sulfonic acid) | 16.42 | 230.16 |
| 4 | 53.56 | 7.56 | 0.59 (p-toluene sulfonic acid) | 16.42 | 231.93 |
| 5 | 53.56 | 7.56 | 17.5(5%) (Boric acid) | 16.23 | 201.73 |
| 6 | 53.56 | 7.56 | 0.47 (50%) (Hypophosphoro us acid) | 15.91 | 213.23 |
| 7 | 53.56 | 7.56 | 3.09(10.0%) (Oxalic acid) | 16.42 | 229.43 |
| 8 | 50.62 | 7.15 | 2.49 (48%) (Hypobromic acid) | 15.5 | 236.32 |
| 9 | 53.56 | 7.56 | 1.1(85%) (Phosphoric acid) | 16.2 | 221.58 |

Examples 2–9 and comparative example A were tested for dry tensile strength and wet tensile strength according to the following methods: the cured sheet was cut into 1 inch by 4 inch strips. Strips were tested for dry tensile strength by placing them in the jaws of a Thwing-Albert Intelect 500 tensile tester. Samples were pulled apart at a crosshead speed of 2 inches/minute. Wet tensile strength was measured by soaking a second set of identically prepared cured sheet strips. The samples were soaked in 85 C. water for 1 hour. The samples were removed from the water and tested immediately for tensile strength while still wet. The % retention was calculated. The results are shown in Table 2.

Wet tensile strength of a curable aqueous composition-treated nonwoven which is a substantial fraction of dry tensile strength of a similarly treated monwoven is taken herein to indicate that a composition has cured, and that useful high temperature performance of the cured aqueous composition-treated nonwoven results.

TABLE 2

| Example | Accelerator | % | Dry Tensile, lb/inch | Wet Tensile, lb/inch | % Retention, W/D × 100 |
|---|---|---|---|---|---|
| Comp. A | None | 0 | 8.8 | 1.5 | 17.0 |
| 2 | Fluoboric acid | 1.0 | 8.7 | 5.0 | 57.5 |
| 3 | p-Toluene sulfonic acid | 7.5 | 8.7 | 0 | 0 |

TABLE 2-continued

| Example | Accelerator | % | Dry Tensile, lb/inch | Wet Tensile, lb/inch | % Retention, W/D × 100 |
|---|---|---|---|---|---|
| 4 | p-Toluene sulfonic acid | 1.9 | 7.0 | 0 | 0 |
| 5 | Boric acid | 2.8 | 10.5 | 0 | 0 |
| 6 | Hypophosphoric acid | 0.8 | 10.7 | 3.8 | 35.5 |
| 7 | Oxalic acid | 1.0 | 8.0 | 0 | 0 |
| 8 | hypobromic acid | 3.8 | 9.8 | 1.9 | 19.4 |
| 9 | Phosphoric acid | 3.0 | 9.9 | 1.0 | 10.1 |

This data demonstrates that fluoboric acid leads to a high level of crosslinking in the test system under the stated cure conditions. No correlation to acid strength was observed.

EXAMPLE 10
Preparation of Binder with Fluoroborate Sodium Salt

To 50.1 grams of polyacrylic acid (10,000 Mw) was added 7.07 grams triethanolamine, 0.6 grams sodium fluoroborate, 15.07 grams Dow Corning Z-6040 silane (1.0%) and 230.15 grams water. This mixture contained 10% active ingredients with a pH about 3.0 and 8 cps viscosity. The binder was applied as described in Example 1.

EXAMPLES 11–13
Preparation of Binders with Other Fluoroborate Salts

Samples 11–13 and comparatives B and C were prepared according to Example 10 with the ingredient amounts listed in Table 3.

TABLE 3

| Example | Grams Polyacid | Grams TEA | Grams Accelerator | Grams Silane (1.0%) | Grams Water |
|---|---|---|---|---|---|
| Comp. B | 50.11 | 7.07 | None | 14.77 | 225.02 |
| Comp. C | 50.11 | 7.07 | 1.41 Sodium hypophosphite | 15.35 | 234.79 |
| 11 | 50.11 | | 0.54 (98%) (potassium fluoroborate | 15.25 | 234.18 |
| 12 | 50.11 | 7.10 | 3.5(40%) (zinc fluoroborate) | 15.25 | 230.08 |
| 13 | 50.11 | 7.10 | 1.4(97%) (ammonium fluoroborate) | 15.25 | 232.18 |

Examples 10–13 and comparative examples B and C were tested for dry tensile strength, wet tensile strength according to the methods above. The % retention was calculated. The results are shown in Table 4.

TABLE 4

| Example | Accelerator | % | Dry Tensile, lb/inch | Wet Tensile, lb/inch | % Retention, W/D × 100 |
|---|---|---|---|---|---|
| Comp. B | None | 0 | 10.6 | 2.0 | 18.9 |
| Comp. C | SHP | 3.8 | 10.3 | 6.5 | 63.1 |
| 10 | Sodium tetrafluoroborate | 2.0 | 8.6 | 5.0 | 58.0 |
| 11 | Potassium tetrafluoroborate | 1.8 | 9.8 | 5.2 | 53.1 |
| 12 | Zinc tetrafluoroborate | 4.7 | 10.2 | 4.5 | 44.1 |
| 13 | Ammonium tetrafluoroborate | 4.6 | 8.8 | 4.1 | 46.6 |

This data demonstrates that different tetrafluoroborates give significantly better wet strength retention compared to the system without accelerator, and that the retention with the sodium tetrafluoroborate is slightly better than the other tetrafluoroborate salts.

Example 14
Effect of Accelerator Level on The Performance of SHP vs $NaBF_4$

A. 0.25% SHP: To 50.11 grams polyacrylic acid (10,000 Mw) was added 7.07 grams triethanolamine, 0.090 grams sodium hypophosphite, 14.78 grams Dow Corning Z-6040 silane (1.0%) and 224.97 grams water. The mixture contained 10% active ingredients with a pH about 3.0 and 8 cps viscosity. The binder was applied as described in Example 1.

B. 0.25% $NaBF_4$: To 50.11 grams polyacrylic acid (10,000 Mw) was added 7.07 grams triethanolamine, 0.075 grams sodium fluoroborate, 14.78 grams Dow Corning Z-6040 silane (1.0%) and 224.97 grams water. The mixture contained 10% active ingredients with a pH about 3.0 and 8 cps viscosity. The binder was applied as described in Example 1.

Examples C–K, and Comparative D, were prepared the same as above except for the amounts listed in Table 5.

TABLE 5

| Example | Grams Polyacid | Grams TEA | Grams Accelerator | % (on solids) | Grams Silane (1.0%) | Grams Water |
|---|---|---|---|---|---|---|
| Comp. D | 50.11 | 7.07 | 0 | 0 | 14.78 | 224.97 |
| 14-C | 50.11 | 7.07 | 0.18 (SHP) | 0.5 | 14.8 | 226.99 |
| 14-D | 50.11 | 7.07 | 0.15($NaBF_4$) | 0.5 | 14.8 | 226.99 |
| 14-E | 50.11 | 70.7 | 0.36(SHP) | 1.0 | 14.9 | 226.89 |
| 14-F | 50.11 | 7.07 | 0.3($NaBF_4$) | 1.0 | 14.9 | 226.89 |
| 14-G | 50.11 | 7.07 | 0.72(SHP) | 2.0 | 15.0 | 229.5 |
| 14-H | 50.11 | 7.07 | 0.6($NaBF_4$) | 2.0 | 15.0 | 229.5 |
| 14-I | 50.11 | 7.07 | 1.08(SHP) | 3.0 | 15.2 | 222.0 |
| 14-J | 50.11 | 7.07 | 0.9($NaBF_4$) | 3.0 | 15.9 | 232.0 |
| 14-K | 50.11 | 7.07 | 1.42(SHP) | 4.0 | 15.3 | 219.9 |

Examples 14-A–K and comparative example D were tested for dry tensile strength, wet tensile strength according to the methods above. The % retention was calculated. The results are shown in Table 6.

TABLE 6

| Example | Accelerator | % | Dry Tensile, lb/inch | Wet Tensile, lb/inch | % Retention, W/D × 100 |
|---|---|---|---|---|---|
| Comp. D | None | 0 | 10.3 | 1.2 | 11.7 |
| A | SHP | 0.25 | 11.1 | 1.3 | 11.7 |
| B | $NaBF_4$ | 0.25 | 11.1 | 4.9 | 44.2 |
| C | SHP | 0.5 | 10.6 | 2.6 | 24.5 |
| D | $NaBF_4$ | 0.5 | 11.0 | 5.6 | 50.9 |
| E | SHP | 1.0 | 9.4 | 4.3 | 45.7 |
| F | $NaBF_4$ | 1.0 | 11.6 | 6.6 | 57.0 |
| G | SHP | 2.0 | 8.8 | 5.8 | 65.9 |
| H | $NaBF_4$ | 2.0 | 10.5 | 6.1 | 58.1 |
| I | SHP | 3.0 | 9.8 | 7.3 | 74.5 |
| J | $NaBF_4$ | 3.0 | 9.5 | 5.3 | 55.3 |
| K | SHP | 4.0 | 10.5 | 7.6 | 72.5 |

This data demonstrates that while SHP gives higher retention at higher use levels, the $NaBF_4$ clearly has higher retention at lower use levels.

EXAMPLE 15
Comparison of SHP vs NaBF4 at Two Temperatures

Binder solutions were prepared as described for Comparative B and C and Examples 14-F and 14-H. The binder solutions were applied to glass fiber substrate as described in Example 1. Half of the samples were cured for 3 minutes at 180° C. The other half of the samples were cured for 3 minutes at 190° C. Examples 14-F and 14-H and Comparative examples B and C were tested for dry tensile strength, wet tensile strength according to the methods above. The % retention was calculated. The results are shown in Table 7.

TABLE 7

| Example | Accelerator | % | Dry Tensile, lb/inch 180° C. Cure | Dry Tensile, lb/inch 190° C. Cure | Wet Tensile, lb/inch 180° C. Cure | Wet Tensile, lb/inch 190° C. Cure | % Retention, W/D × 100 180° C. Cure | % Retention, W/D × 100 190° C. Cure |
|---|---|---|---|---|---|---|---|---|
| Comp. B | None | 0 | 9.9 | 12.3 | 0.2 | 2.0 | 2.0 | 16.4 |
| Comp. C | SHP | 3.8 | 11.7 | 10.8 | 3.0 | 7.2 | 25.3 | 66.4 |
| 15-F | NaBF$_4$ | 1.0 | 10.2 | 10.8 | 2.2 | 5.9 | 21.6 | 54.6 |
| 15-H | NaBF$_4$ | 2.0 | 8.5 | 11.6 | 1.8 | 5.9 | 21.2 | 50.9 |

These data demonstrate that sodium tetrafluoroborate gives comparable retention at a lower temperature and lower use levels than with SHP.

EXAMPLE 16
The Effect of SHP/NaBF$_4$ Combinations

Binder solutions of SHP and/or NaBF4 were prepared and blended according to the amounts listed in Table 8.

TABLE 8

| Example | Grams Polyacid | Grams TEA | Grams Accelerator | Grams Silane (1.0%) | Grams Water |
|---|---|---|---|---|---|
| 16-A | 50.11 | 7.07 | 0.18 (sodium hypophosphite) | 14.8 | 226.99 |
| 16-B | 50.11 | 7.07 | 0.15 (sodium fluoroborate) | 14.8 | 226.99 |
| 16-C | 50.11 | 7.07 | 0.36 (sodium hypophosphite) | 14.9 | 226.89 |
| 16-D | 50.11 | 7.07 | 0.3 (sodium fluoroborate) | 14.9 | 227.60 |
| 16-E | 50.11 | 7.07 | 0.18 (sodium hypophosphite) and 0.15 (sodium fluoroborate) | 14.92 | 227.54 |

Examples 16 A–E were tested for dry tensile strength, wet tensile strength according to the methods above. The % retention was calculated. The results are shown in Table 9.

TABLE 9

| Example | Accelerator | % | Tensile, lb/inch | Tensile, lb/inch | % Retention, W/D × 100 |
|---|---|---|---|---|---|
| 16A | SHP | 0.5 | 10.6 | 2.6 | 24.5 |
| 16B | NaBF$_4$ | 0.5 | 10.3 | 5.5 | 53.4 |
| 16C | SHP | 1.0 | 10.5 | 4.8 | 45.7 |
| 16D | NaBF$_4$ | 1.0 | 9.4 | 5.4 | 57.5 |
| 16E | SHP/NaBF$_4$ | 0.5/0.5 | 9.7 | 7.3 | 75.3 |

This data demonstrates that the combination of sodium tetrafluoroborate and sodium hypophosphite accelerators is unexpectedly efficient when compared with either accelerator alone.

What is claimed is:

1. A formaldehyde-free curable aqueous composition comprising:
   (a) a polycarboxylic acid comprising at least two carboxylic acid groups, anhydride groups, or salts of the polyacid thereof;
   (b) an active hydrogen containing compound containing at least two active hydrogen groups selected from the group consisting of hydroxyl, primary amino, secondary amino, and mixtures thereof;
   (c) a fluoroborate accelerator; and
   (d) a phosphorus containing accelerator selected from the group consisting of hypophosphorus acid, sodium hypophosphite, sodium phosphite, potassium phosphite, disodium pyrophosphate, tetrasodium pyrophosphate, sodium tripolyphosphate, potassium tripolyphosphate, potassium phosphate, and mixtures thereof; wherein the ratio of the number of equivalents of said carboxylic acid groups, anhydride groups, or salts thereof to the number of equivalents of said active hydrogen groups is from 1/0.01 to about 1/3, and the said carboxylic acid groups, anhydride groups, or salts thereof are neutralized to an extent of less than 35 mole % with a fixed base.

2. The formaldehyde-free curable aqueous composition of claim 1 wherein said polycarboxylic is a polymeric acid.

3. The formaldehyde-free curable aqueous composition of claim 1 wherein said active hydrogen containing compound is an alkanolamine.

4. A method for curing formaldehyde-free polyacids comprising:
   (a) forming a formaldehyde-free curable aqueous composition comprising admixing:
      (1) a polycarboxylic acid comprising at least two carboxylic acid groups, anhydride groups, or salts thereof;
      (2) an active hydrogen containing compound containing at least two active hydrogen groups selected from the group consisting of hydroxyl, primary amino, secondary amino, and mixtures thereof;
      (3) a fluoroborate accelerator; and
      (4) a phosphorus containing accelerator selected from the group consisting of hypophosphorus acid, sodium hypophosphite, sodium phosphite, potassium phosphite, disodium pyrophosphate, tetrasodium pyrophosphate, sodium tripolyphosphate, potassium tripolyphosphate, potassium phosphate, and mixtures thereof: wherein the ratio of the number of equivalents of said carboxylic acid groups, anhydride groups, or salts thereof to the number of equivalents of said active hydrogen groups is from 1/0.01 to about 1/3, and the said carboxylic acid groups, anhydride groups, or salts thereof are neutralized to an extent of less than 35 mole % with a fixed base; and
   (b) heating said formaldehyde-free curable aqueous composition at a temperature of from 150° C. to 400° C.

5. The method of claim 4 wherein said polycarboxylic acid is a polymeric polyacid.

6. The method of claim 4 wherein said active hydrogen containing compound is an alkanolamine.

7. A method for bonding glass fiber heat-resistant nonwovens with a formaldehyde-free binder comprising:
(a) forming a formaldehyde-free curable aqueous composition comprising admixing:
(1) a polycarboxylic acid comprising at least two carboxylic acid groups, anhydride groups, or salts thereof;
(2) an active hydrogen containing compound containing at least two active hydrogen groups selected from the group consisting of hydroxyl, primary amino, secondary amino, and mixtures thereof;
(3) a fluoroborate accelerator; and
(4) a phosphorus containing accelerator selected from the group consisting of hypophosphorus acid, sodium hypophosphite, sodium phosphite, potassium phosphite, disodium pyrophosphate, tetrasodium pyrophosphate, sodium tripolyphosphate, potassium tripolyphosphate, potassium phosphate, and mixtures thereof: wherein the ratio of the number of equivalents of said carboxylic acid groups, anhydride groups, or salts thereof to the number of equivalents of said active hydrogen groups is from 1/0.01 to about 1/3, and wherein said carboxylic acid groups, anhydride groups, or salts thereof are neutralized to an extent of less than 35 mole % with a fixed base;
(b) contacting said glass fiber heat-resistant nonwoven with said formaldehyde-free curable aqueous composition; and
(c) heating said formaldehyde-free curable aqueous composition at a temperature of from 150° C. to 400° C.

8. The method of claim 7 wherein said polyacarboxylic acid is a polymeric acid.

9. The method of claim 7 wherein said active hydrogen containing compound is an alkanolamine.

* * * * *

UNITED STATES PATENT AND TRADEMARK OFFICE
CERTIFICATE OF CORRECTION

PATENT NO. : 5,977,232
DATED : November 2, 1999
INVENTOR(S) : Charles Thomas Arkens, Scott Lind Egolf It is certified that error appears in the above-identified patent and that said Letters Patent is hereby corrected as shown below:

Col. 12, line 21,
   Change "hypophosphorus" to --hypophosphorous--

Col. 12, line 34
   Insert acid following polycarboxylic,
   polycarboxylic --acid-- is a.....

Col. 12, line 50,
   Change "hypophosphorus" to --hypophosphorous--

Column 13, line 15
   Change "hypophosphorus" to --hypophosphorous--

Column 14, line 15,
   Change polyacarboxylic to --polycarboxylic--.

Signed and Sealed this

Nineteenth Day of September, 2000

Q. TODD DICKINSON

*Attest:*

*Attesting Officer*    Director of Patents and Trademarks